US011371147B2

(12) United States Patent
Coe et al.

(10) Patent No.: US 11,371,147 B2
(45) Date of Patent: Jun. 28, 2022

(54) MICROWAVE PLASMA REACTOR FOR MANUFACTURING SYNTHETIC DIAMOND MATERIAL

(75) Inventors: Steven Edward Coe, Ascot (GB); Jonathan James Wilman, Ascot (GB); Daniel James Twitchen, Ascot (GB); Geoffrey Alan Scarsbrook, Ascot (GB); John Robert Brandon, Ascot (GB); Christopher John Howard Wort, Ascot (GB)

(73) Assignee: Element Six Technologies Limited, Didcot (GB)

( * ) Notice: Subject to any disclaimer, the term of this patent is extended or adjusted under 35 U.S.C. 154(b) by 281 days.

(21) Appl. No.: 13/994,903

(22) PCT Filed: Dec. 14, 2011

(86) PCT No.: PCT/EP2011/072825
§ 371 (c)(1),
(2), (4) Date: Oct. 29, 2013

(87) PCT Pub. No.: WO2012/084661
PCT Pub. Date: Jun. 28, 2012

(65) Prior Publication Data
US 2015/0030786 A1 Jan. 29, 2015

Related U.S. Application Data

(60) Provisional application No. 61/439,322, filed on Feb. 3, 2011.

(30) Foreign Application Priority Data

Dec. 23, 2010 (GB) .............................. GB1021870.9

(51) Int. Cl.
*C23C 16/27* (2006.01)
*C23C 16/455* (2006.01)
(Continued)

(52) U.S. Cl.
CPC ...... *C23C 16/45563* (2013.01); *C23C 16/274* (2013.01); *C23C 16/45504* (2013.01);
(Continued)

(58) Field of Classification Search
CPC ........ C23C 16/45563; C23C 16/45504; C23C 16/274; C23C 16/511; C23C 16/45565;
(Continued)

(56) References Cited

U.S. PATENT DOCUMENTS

| | | |
|---|---|---|
| 4,869,923 A | 9/1989 | Yamazaki |
| 4,943,345 A | 7/1990 | Asmussen et al. |

(Continued)

FOREIGN PATENT DOCUMENTS

| | | |
|---|---|---|
| CN | 101385129 | 3/2009 |
| EP | 0343602 A3 | 11/1989 |

(Continued)

OTHER PUBLICATIONS https://www.merriam-webster.com/dictionary/nozzle.*

(Continued)

*Primary Examiner* — Rudy Zervigon
(74) *Attorney, Agent, or Firm* — Kilpatrick Townsend & Stockton LLP (57) ABSTRACT

A microwave plasma reactor for manufacturing synthetic diamond material via chemical vapour deposition, the microwave plasma reactor includes a plasma chamber, a substrate holder, a microwave coupling configuration for feeding microwaves into the plasma chamber, and a gas flow system for feeding process gases into the plasma chamber and removing them therefrom. The gas flow system includes a gas inlet array having a plurality of gas inlets for directing the process gases towards the substrate holder. The gas inlet (Continued)

array includes at least six gas inlets disposed in a substantially parallel or divergent orientation relative to a central axis of the plasma chamber.

16 Claims, 3 Drawing Sheets

(51) Int. Cl.
    *C23C 16/511*     (2006.01)
    *H01J 37/32*     (2006.01)
    *C30B 29/04*     (2006.01)
    *C30B 25/10*     (2006.01)

(52) U.S. Cl.
    CPC ...... *C23C 16/45565* (2013.01); *C23C 16/511* (2013.01); *C30B 25/105* (2013.01); *C30B 29/04* (2013.01); *H01J 37/32* (2013.01); *H01J 37/3244* (2013.01); *H01J 37/32192* (2013.01); *H01J 37/32238* (2013.01); *H01J 37/32449* (2013.01)

(58) Field of Classification Search
    CPC ............. H01J 37/32449; H01J 37/3244; H01J 37/32192; H01J 37/32238; C30B 29/04; C30B 25/105
    USPC .............. 118/723 MW, 715–733; 427/249.7, 427/249.8, 902; 156/345.36, 345.41, 156/345.33, 345.34
    See application file for complete search history.

(56) References Cited

U.S. PATENT DOCUMENTS

| | | | |
|---|---|---|---|
| 4,989,542 A | 2/1991 | Kamo | |
| 5,091,208 A | 2/1992 | Pryor | |
| 5,258,206 A | 11/1993 | Hayashi et al. | |
| 5,261,959 A | 11/1993 | Gasworth | |
| 5,273,731 A | 12/1993 | Anthony et al. | |
| 5,273,790 A | 12/1993 | Herb et al. | |
| 5,302,226 A | 4/1994 | Yamazaki et al. | |
| 5,302,803 A | 4/1994 | Stevens et al. | |
| 5,311,103 A | 5/1994 | Asmussen et al. | |
| 5,397,396 A | 3/1995 | Kosky et al. | |
| 5,501,740 A | 3/1996 | Besen et al. | |
| 5,571,577 A | 11/1996 | Zhang et al. | |
| 5,616,373 A * | 4/1997 | Karner .................. | C23C 16/272 427/122 |
| 5,643,365 A | 7/1997 | Blinov et al. | |
| 5,683,759 A | 11/1997 | Shepard, Jr. et al. | |
| 5,747,362 A * | 5/1998 | Visser .................. | C23C 16/455 204/298.07 |
| 5,981,057 A | 11/1999 | Collins | |
| 6,015,597 A * | 1/2000 | David ...................... | B01J 2/006 427/577 |
| 6,091,045 A | 7/2000 | Mabuchi et al. | |
| 6,106,678 A | 8/2000 | Shufflebotham et al. | |
| 6,158,383 A | 12/2000 | Watanabe et al. | |
| 6,254,683 B1 | 7/2001 | Matsuda et al. | |
| 6,319,439 B1 | 11/2001 | Lee et al. | |
| 6,325,018 B1 | 12/2001 | Hongoh | |
| 6,388,632 B1 | 5/2002 | Murakawa et al. | |
| 6,414,338 B1 | 7/2002 | Anderson | |
| 6,427,621 B1 * | 8/2002 | Ikegawa .................. | C23C 16/509 118/723 E |
| 6,433,298 B1 | 8/2002 | Ishii | |
| 6,487,986 B1 | 12/2002 | Liehr et al. | |
| 6,565,661 B1 * | 5/2003 | Nguyen ................ | C23C 16/4557 118/715 |
| 6,645,343 B1 | 11/2003 | Wild et al. | |
| 6,793,733 B2 | 9/2004 | Janakiraman et al. | |
| 7,879,182 B2 * | 2/2011 | Ohmi .................. | H01J 37/3244 156/345.33 |
| 8,747,556 B2 * | 6/2014 | Lam .................. | H01J 37/32449 156/345.33 |
| 2001/0023663 A1 | 9/2001 | Kazumi et al. | |
| 2001/0036465 A1 | 11/2001 | Ishii et al. | |
| 2002/0000202 A1 * | 1/2002 | Yuda .................. | C23C 16/45574 118/723 ER |
| 2003/0107003 A1 | 6/2003 | Whitehead | |
| 2003/0150561 A1 | 8/2003 | Ishii et al. | |
| 2003/0150846 A1 | 8/2003 | Ishii et al. | |
| 2003/0200914 A1 | 10/2003 | Noguchi et al. | |
| 2004/0045674 A1 | 3/2004 | Ishii et al. | |
| 2005/0005853 A1 | 1/2005 | Behle et al. | |
| 2005/0103265 A1 * | 5/2005 | Gianoulakis ........ | C23C 16/4412 118/715 |
| 2005/0109267 A1 | 5/2005 | Linares et al. | |
| 2005/0205015 A1 * | 9/2005 | Sasaki ............... | C23C 16/45565 118/723 MA |
| 2005/0250338 A1 * | 11/2005 | Ohmi ..................... | C23C 16/511 438/726 |
| 2005/0266606 A1 | 12/2005 | Chevallier et al. | |
| 2006/0266279 A1 | 11/2006 | Mokuno | |
| 2007/0128876 A1 * | 6/2007 | Fukiage .............. | C23C 16/4405 438/710 |
| 2007/0163996 A1 | 7/2007 | Horiguchi | |
| 2007/0221294 A1 | 9/2007 | Sasaki | |
| 2008/0099768 A1 | 5/2008 | Scarsbrook et al. | |
| 2008/0134959 A1 | 6/2008 | Kasu et al. | |
| 2008/0156256 A1 | 7/2008 | Linares et al. | |
| 2008/0190356 A1 | 8/2008 | Bhandari | |
| 2008/0303744 A1 | 12/2008 | Hirayama et al. | |
| 2010/0028556 A1 | 2/2010 | Linares et al. | |
| 2010/0034984 A1 | 2/2010 | Asmussen et al. | |
| 2010/0101728 A1 | 4/2010 | Iwasaki | |
| 2010/0178234 A1 | 7/2010 | Noguchi | |
| 2010/0189924 A1 * | 7/2010 | D'Evelyn ............. | C23C 16/274 427/575 |
| 2011/0174778 A1 * | 7/2011 | Sawada ............. | H01J 37/32091 216/68 |

FOREIGN PATENT DOCUMENTS

| | | |
|---|---|---|
| EP | 0390209 A3 | 10/1990 |
| EP | 0447031 A1 | 9/1991 |
| EP | 0480581 | 9/1991 |
| EP | 0467043 A2 | 1/1992 |
| EP | 0487292 A1 | 5/1992 |
| EP | 0526657 A1 | 2/1993 |
| EP | 0546752 A1 | 6/1993 |
| EP | 0582397 A2 | 2/1994 |
| EP | 0597445 A2 | 5/1994 |
| EP | 0695816 A1 | 2/1996 |
| EP | 0727507 A2 | 8/1996 |
| EP | 0758688 A1 | 2/1997 |
| EP | 0822269 | 4/1998 |
| EP | 1500718 A1 | 1/2005 |
| EP | 1643641 A2 | 4/2006 |
| EP | 1463849 | 1/2007 |
| EP | 2108714 A1 | 10/2009 |
| FR | 2798552 | 3/2001 |
| JP | S62162366 A | 7/1987 |
| JP | S62167886 A | 7/1987 |
| JP | S62235393 A | 10/1987 |
| JP | 03281594 C2 | 12/1991 |
| JP | 4009471 A | 1/1992 |
| JP | H04-035029 A | 2/1992 |
| JP | H04-187594 A | 6/1992 |
| JP | 4-228495 A | 8/1992 |
| JP | H04238896 | 8/1992 |
| JP | H05013342 A | 1/1993 |
| JP | H06-151336 A | 5/1994 |
| JP | H061251158 A | 9/1994 |
| JP | H08133893 A | 5/1996 |
| JP | H09-111461 A | 4/1997 |
| JP | 2001007385 | 1/2001 |
| JP | 2002265296 A | 3/2001 |
| JP | 2001-148376 A | 5/2001 |
| JP | 2001-244256 A | 9/2001 |
| JP | 2003045810 A | 2/2003 |

(56) References Cited

FOREIGN PATENT DOCUMENTS

| | | | |
|---|---|---|---|
| JP | 2003-142471 A | 5/2003 | |
| JP | 2004235434 A | 8/2004 | |
| JP | 2004244298 A | 9/2004 | |
| JP | 2005-033167 A | 2/2005 | |
| JP | 2005-044822 A | 2/2005 | |
| JP | 2006-120853 A | 5/2006 | |
| JP | 2007142195 | 6/2007 | |
| JP | 2007273913 A | 10/2007 | |
| JP | 2007284773 A | 11/2007 | |
| JP | 2007331955 A | 12/2007 | |
| JP | 2006286269 A | 5/2008 | |
| JP | 2009280421 A | 12/2009 | |
| JP | WO 2010 004997 | * | 1/2010 |
| KR | 20020061768 A | 7/2002 | |
| RU | 2315826 | 6/2005 | |
| SE | 500740 C2 | 8/1994 | |
| WO | 98/33362 A1 | 7/1998 | |
| WO | 2002/077319 A1 | 10/2002 | |
| WO | 2003/040440 A2 | 5/2003 | |
| WO | 03/052174 A2 | 6/2003 | |
| WO | 2006/020424 A2 | 2/2006 | |
| WO | 2006/117621 | 11/2006 | |
| WO | 2006/127611 A2 | 11/2006 | |
| WO | 2007/092893 A2 | 8/2007 | |
| WO | 2008/025899 | 3/2008 | |
| WO | 2008/029258 | 3/2008 | |
| WO | 2008/090510 | 7/2008 | |
| WO | 2008/123605 A1 | 10/2008 | |
| WO | 2010/004836 A1 | 1/2010 | |
| WO | 2010/021382 A1 | 2/2010 | |
| WO | 2010/084655 | 7/2010 | |

OTHER PUBLICATIONS

Popov, "High density Plasma sources: design, physics and performance", Noyes publications, 1996, pp. 258-295.
Nagatsu et al., "Plasma reactor with two-microwave oscillators for diamond film synthesis", Thin Solid Films, Science Direct, 2006 pp. 617-621.
Balmer et al., Chemical vapour deposition synthetic diamond: materials, technology and applications, Journal of Physics: Condensed Matter, 21, 2009.
Whitfield et al., Nucleation and growth of diamond films on single crystal and polycrystalline tungsten substrates, Diamond and Related Materials, vol. 9, pp. 262-268, 2000.
International Search Report issued on PCT/EP2011/072824, dated May 3, 2012.
Silva et al., Microwave Analysis of PACVD diamond deposition reactor based on electromagnetic materials, Diamond & Related Materials, vol. 19, pp. 397-403, 2010.
Search Report issued on GB1121517.5, dated Mar. 27, 2012.
Funer et al., Simulation and development of optimized microwave plasma reactors for diamond deposition, Surface and Coatings Technology, 1999, 853-862, vol. 116-119.
Hassouni et al., Self-consistent microwave field and plasma discharge simulations for a moderate pressure hydrogen discharge reactor, Journal of Applied Physics, 1999, pp. 134-151, 86(1).
Search Report issued on GB1021913.7, dated Apr. 21, 2011.
Kosky et al., Fracture-free release of CVD diamond, Diamond and Related Materials 5 (1996) pp. 1313-1317.
Asmussen, et al., Multiple substrate microwave plasma-assisted chemical vapor deposition single crystal diamond syntheses, Applied Physics Letters, p. 93, 031502, 2008.
Chae, et al., The 8-inch free-standing CVD diamond wafer fabricated by DC-PACVD, Diamond and Related Materials, 19, 2010, pp. 1168-1171.
Gray, et al., Free-standing CVD diamond wafers for thermal management by d.c. arc jet technology, Diamond and Related Materials 8, 1999, 903-908.
Liao, Samuel Y., Microwave Devices and Circuits, 3d Edition, published by Prentice-Hall, Inc., New Jersey pp. 144-156.
Hassouni et la., Modelling of diamond deposition microwave cavity generated plasmas, J. Phys. D. Appl. Phys,. 43 (2010) 153001.
Hemawan, et a., Improved microwave plasma cavity reactor for diamond synthesis at high-pressure and high power density, Diamond & Related Materials 19 (2010) 1446-1452.
Alam et al., Adhesion of diamond coatings on tungsten substrates, Journal of Adhesion Science and Technology, vol. 9, No. 6, 1995 Netherlands, 653-679.
Feng, et al., Surface stress measurement with interference microscopy of thick homoepitaxial single-crystal diamond layers, Diamond & Related Materials 19 (2010) 1453-1456.
Yamada, Simulation with an improved plasma model utilized to design a new structure of microwave plasma dischage for chemical vapor deposition of diamond crystals, Diamond and Related Materials, 17, Issues 4-5 (2008), pp. 494-497.
Achard, J., et al., Thick boron doped diamond single crystals for high power electronics, Diamond & Related Materials, 20, pp. 145-152, 2010.
Lee, et al., Single-cathode DC PACVD process for large-area CVD diamond wafer fabrication, 203rd Meeting of the Electrochemical Society, Eighth International Symposium on Diamond Materials, 2003.
Funer et al., Numerical simulations of microwave plasma reactor for diamond CVD, Surface and Coatings Technology, 74-75 (1995), pp. 221-226.
International Search Report issued on PCT/EP2011/072820, dated Mar. 30, 2012.
Search Report issued on GB1121474.9, dated Mar. 27, 2012.
Search Report issued on GB1305030.7 dated Apr. 16, 2013.
Search Report issued on GB1305041.4 dated Apr. 15, 2013.
Search Report issued on GB1305045.5 dated Apr. 16, 2013.
Search Report issued on GB1121486.3 dated Apr. 12, 2012.
Search Report issued on GB1021870.9 dated Apr. 6, 2011.
Search Report issued on GB1021865.9 dated Apr. 20, 2011.
Search Report issued on GB1121494.7 dated Apr. 7, 2012.
Search Report issued on GB1021860.0 dated Apr. 20, 2011.
Search Report issued on GB1121492.1 dated Apr. 12, 2012.
Search Report issued on GB1021855.0 dated May 31, 2011.
Search Report issued on GB1121499.6 dated Jan. 27, 2012.
Search Report issued on GB1121505.0 dated Mar. 29, 2012.
International Search Report issued on PCT/EP2011/072825 dated Mar. 30, 2012.
Search Report issued on GB1021853.5 dated Mar. 30, 2011.
International Search Report issued on PCT/EP2011/072823, dated Jul. 4, 2012.
International Search Report issued on PCT/EP2011/072822, dated May 23, 2012.
International Search Report issued on PCT/EP2011/072818, dated Jun. 22, 2012.
International Search Report issued on PCT/EP2011/072821, dated Mar. 2, 2012.
Silva, F., et al., Microwave engineering of plasma-assisted CVD reactors for diamond deposition, Journal of Physics; Condensed Matter, vol. 21, No. 364202, 2009.
Nagatsu, M., et al., "Diagnostics of plasma ball formed in high pressure microwave plasma for diamond film synthesis," Diamond and Related Materials, 2002, pp. 562-566, vol. 11, Elsevier Science B.V.

* cited by examiner

MICROWAVE PLASMA REACTOR FOR MANUFACTURING SYNTHETIC DIAMOND MATERIAL

FIELD OF INVENTION

The present invention relates to a microwave plasma reactor for manufacturing synthetic diamond material using chemical vapour deposition techniques.

BACKGROUND OF INVENTION

Synthesis of diamond material using chemical vapour deposition (CVD) techniques is now well known. Useful background information relating to the chemical vapour deposition of diamond materials may be found in a special issue of the Journal of Physics: Condensed Matter, Vol. 21, No. 36 (2009) which is dedicated to diamond related technology. For example, the review article by R. S Balmer et al. gives a comprehensive overview of CVD diamond materials, technology and applications (see "Chemical vapour deposition synthetic diamond: materials, technology and applications" J. Phys.: Condensed Matter, Vol. 21, No. 36 (2009) 364221).

A range of possible microwave plasma reactors for diamond film growth via a chemical vapour deposition (CVD) process are known in the art. Such reactors have a variety of different designs. Common features include: a plasma chamber; a substrate holder disposed in the plasma chamber; a microwave generator for forming the plasma; a coupling configuration for feeding microwaves from the microwave generator into the plasma chamber; a gas flow system for feeding process gases into the plasma chamber and removing them therefrom; and a temperature control system for controlling the temperature of a substrate on the substrate holder. A useful overview article summarizing various possible reactor designs is given in the previous mentioned Journal of Physics (see "Microwave engineering of plasma-assisted CVD reactors for diamond deposition" J. Phys.: Condensed Matter, Vol. 21, No. 36 (2009) 364202).

Having regard to the patent literature, U.S. Pat. No. 6,645,343 (Fraunhofer) discloses an example of a microwave plasma reactor configured for diamond film growth via a chemical vapour deposition process. The reactor described therein comprises a plasma chamber with a substrate holder mounted on a base thereof. A cooling device is provided below the substrate holder for controlling the temperature of a substrate on the substrate holder. Furthermore, a gas inlet and a gas outlet are provided in the base of the plasma chamber for supplying and removing process gases. A microwave generator is coupled to the plasma chamber via a high-frequency coaxial line which is subdivided at its delivery end above the plasma chamber and directed at the periphery of the plasma chamber to an essentially ring-shaped microwave window in the form of a quartz ring. The invention as described in this document focuses on the ring-shaped microwave window and teaches that because the coupling is distributed over a large surface, high microwave power levels can be coupled without high electric field intensities developing at the microwave window thus reducing the danger of window discharge.

EP0480581 (Applied Science & Technology Inc.) describes an alternative arrangement to that described above. The arrangement also comprises a plasma chamber in which a substrate holder is mounted above a base thereof. The arrangement also comprises a microwave generator coupled to an upper portion of the plasma chamber via a wave guide. The major difference between the arrangements described in EP0480581 and U.S. Pat. No. 6,645,343 lies in how the process gas is supplied and removed from the plasma chamber. In U.S. Pat. No. 6,645,343, the gas inlet is provided in a base of the plasma chamber adjacent to the substrate holder. In contrast, EP0480581 discloses an arrangement in which the gas inlet is positioned in a top portion of the plasma chamber directly above the substrate holder and configured to directly feed gas at high velocity towards the substrate. Process gas is removed at an outlet in or near the base of the plasma chamber and recirculated to the inlet using a pump. As such, this document discloses a high gas flow system using recirculation and a single inlet disposed axially above the substrate. The apparent advantage of such a system is that the high velocity gas flow transports activated gas species from the plasma to the substrate by convection. This enables the growth of large area diamond films when compared with systems which rely upon diffusion of activated gas species from the plasma to the substrate as is the case, for example, in U.S. Pat. No. 6,645,343.

Variations on the axially oriented gas flow arrangement described in EP048581 are known. For example, the commercially available IPLAS microwave plasma reactor comprises four gas inlet holes disposed in a top portion of the plasma chamber over the substrate holder.

More recently, US2010/0189924 (Lockheed) discloses another system in which process gas is injected into the plasma chamber at high velocity to establish convective transfer of activated gas species from the plasma to the substrate in a similar manner to EP0480581. The configuration disclosed in this document comprises a flattened bell-shape plasma chamber in which a substrate holder is mounted above a base thereof. A microwave generator is coupled to the base of the plasma chamber via a wave guide. Gas inlet ports are provided in a top portion of the plasma chamber above the substrate holder and gas outlet ports are provided in the base of the plasma chamber.

There are several differences between the arrangements described in US2010/0189924 and EP0480581. For example, the position at which microwaves are coupled into the plasma chamber is different, microwaves being coupled in at an upper portion of the chamber in EP0480581 and at the bottom of the chamber in US2010/0189924. Furthermore, the shape of the plasma chamber is significantly different, the chamber being substantially cylindrical in EP0480581 compared to the flattened bell-shape chamber of US2010/0189924 in which the chamber is relatively wide, having a width greater than its height. Further still, the inlet configuration in the top portion of the plasma chamber is different. EP0480581 discloses a single axially disposed gas inlet, positioned directly above the substrate holder and configured to directly feed gas at high velocity towards the substrate. In contrast, US2010/0189924 discloses an inlet arrangement comprising more than one gas inlet which is similar to the commercially available IPLAS reactor. One difference between the more recent reactor design described in US2010/0189924 and the arrangements suggested in the previously described prior art is that US2010/0189924 suggests providing an axially disposed nozzle and at least 3 or 4 further nozzles spaced evenly apart around the central nozzle and angled inwardly such that gas streams emanating from the nozzles cross above the substrate, interacting with each other and with the plasma discharge. It is described that this inwardly angled nozzle arrangement improves uniformity of the diamond film by managing the shape of the plasma discharge, for example intensifying and flattening the hemispherical shape of the plasma discharge, increasing the concentration of reaction species in close proximity to the substrate surface.

The present inventors have identified a number of possible problems with prior art reactor designs. The present inventors concur with the findings of EP0480581 and US2010/0189924 that high flow velocity arrangements can be advantageous for certain applications to improve the deposition rate of a synthetic diamond film using convection rather than diffusion. As such, the present inventors believe that positioning the gas inlet above the substrate so as to direct gas flow axially towards the substrate is a preferable arrangement. However, one problem with the single axially positioned gas inlet arrangement disclosed in EP0480581 is that at very high velocity flows, the gas stream can penetrate through the plasma, essentially punching a hole in the plasma discharge and pushing the plasma outwards towards the sides of the substrate, leading to non-uniform diamond film formation.

The aforementioned problem has been at least partially solved by arrangements such as those provided the IPLAS reactor and US2010/0189924 which utilize a plurality of gas inlets. For example, the IPLAS reactor comprises four parallel oriented gas inlets whereas US2010/0189924 teaches the provision of a central gas inlet nozzle and several further nozzles spaced evenly apart around the central nozzle and angled inwardly. It is described that this inwardly angled nozzle arrangement improves uniformity of the diamond film by managing the shape of the plasma discharge. That is, the gas streams which are angled inwards will push inwards against plasma forced outward by the central gas stream thus constraining the plasma in a lateral direction and preventing a central hole forming in the plasma. While such arrangements may present an improvement over the single gas inlet arrangement described in EP0480581, the present inventors have identified several possible problems with the described arrangements.

One problem is that if the gas streams are angled to laterally constrain the plasma discharge, this will limit the area over which a diamond film can be deposited. Alternatively, if the gas streams are angled to push against a more central region of the plasma such that the outer portions of the plasma are not constrained, then this will actually exacerbate the problem of punch-through in a central region of the plasma, such that the plasma is pushed towards the sides of the substrate leading to non-uniform diamond film formation.

Another possible problem with the arrangement described in US2010/0189924 is that the plasma must be constrained in a lateral direction to ensure that it does not impinge upon the corner portions of the plasma reactor located between the central, vertically extended portion in which the inlet nozzles are provided and the laterally extending side portions of the plasma chamber. These corner portions of the plasma chamber are disposed relatively close to the region in which the plasma discharge is located in use. If the plasma were to impinge on these portions of the wall of the plasma chamber, the wall may be damaged in these regions. Furthermore, contamination by process gases may build up on the wall resulting in a degradation of the diamond film quality formed in the reactor over time. As such, it is apparent that the angled gas streams described in US2010/0189924 are required to laterally constrain the plasma discharge for these reasons.

Another possible problem with the arrangement described in US2010/0189924 is that the plasma must be constrained such that it does not ignite at high energy microwave anti-nodes disposed within the laterally extending side portions of the plasma chamber. This would lead to a reduction in power efficiency and could also damage the wall of the plasma chamber and cause contamination to build up on the walls resulting in a degradation of the diamond film quality formed in the reactor over time.

Yet another possible problem with the arrangement described in US2010/0189924 is that the microwave window is positioned in a base of the plasma chamber down stream of the inlet nozzles. This may lead to contamination of the microwave window with process gases or wall contaminants falling onto the window resulting in a reduction in performance, such as might be associated with increased microwave absorption at the window area.

Although the IPLAS reactor comprises parallel oriented gas inlets rather than gas inlets which are angled inwardly as in US2010/0189924, it has been found that the relatively small number of gas inlets provided by this arrangement is insufficient to provide uniform diamond film formation at high rates over a relatively large area. There is no teaching that indicates having more holes, or even the position of the holes, has any significant influence on deposition conditions.

It is an aim of certain embodiments of the present invention to at least partially solve the aforementioned problems. In particular, it is an aim of certain embodiments of the present invention to provide a method and apparatus for achieving high quality, uniform diamond film formation at high rates over a relatively large area.

In addition to the above, certain embodiments of the present invention are also concerned with methods and apparatus for synthesising CVD diamond comprising one or more dopants. Doping of diamond material during CVD synthesis is known in the art. Common dopants in diamond which may have some desirable use include boron, nitrogen, silicon, and phosphorous. Boron doped diamond is of particular interest as boron doping can, for example, make the diamond material semi-conductive or, at high doping levels, full metallic conduction can be achieved. Boron doped diamond finds applications that range from mechanical applications to electronics and sensors.

There is a need to grow diamond which contains a uniform concentration of boron to maintain consistency of product. For example in polycrystalline diamond, it is desirable to grow large area (e.g. greater than 120 mm diameter), thick (e.g. great than 0.5 mm), free-standing polycrystalline diamond wafers which can be processed using electric discharge machining (EDM) methods. In order to achieve this, the boron concentration needs to be high enough to ensure a reasonable and viable cutting rate, but not so high that it begins to degrade the material properties. Further, the boron concentration must be within these limits over the majority volume of the disk.

A similar argument applies to single crystals, for example wherein a plurality of single crystals might be homoepitaxially grown in a single growth run. Specifications on the boron set by applications that include electronics require all of these diamonds to contain similar boron concentrations.

There is also a need in some methods (particularly in single crystal {100} oriented growth) to find routes to achieve the highest boron concentration necessary for example, for metallic conduction.

A significant amount of work has been performed in this field in relation to boron doped polycrystalline and single crystal diamond material. For example, EP 0 822 269 B1 discloses the basic CVD chemistry required for achieving boron doping. EP1463849 teaches how to achieve uniform boron doping over a single crystal of synthetic CVD diamond material by utilizing a diamond substrate having a surface substantially free of crystal defects.

It is a further aim of certain embodiments of the present invention to provide a method and apparatus which is capable of achieving uniform doping of CVD diamond material over large areas of, for example, polycrystalline diamond material and/or over a large number of single crystal diamonds grown in a single growth run. It is also an aim of certain embodiments to achieve very high levels of doping such as high boron doping concentrations for electronic and sensor applications.

SUMMARY OF INVENTION

The present inventors have found that in contrast to the teachings of US2010/0189924, it is advantageous to provide a gas inlet configuration in which gas inlets are not angled inwardly to interact above the substrate and constrain the plasma in a lateral direction. While the commercially available IPLAS reactor discloses such a non-angled gas inlet configuration, both the IPLAS reactor and the reactor disclosed in US2010/0189924 have a relatively small number of gas inlets. In contrast to both these arrangements, the present inventors have found that instead of providing a relatively small number of gas inlets, the problems of gas stream punch-through in a central region of the plasma discharge at very high gas stream velocities can be reduced by providing a higher number of gas inlets which are substantially parallel or divergent in orientation.

In addition, it has been found that the relatively high number of gas inlets should be closely spaced to ensure a relatively uniform flow of gas. It has been found that providing a relatively high number density of gas inlets in an array improves the uniformity of gas flow towards the substrate in use and allows the plasma to be uniformly flattened and shaped relative to the substrate to achieve uniform diamond film formation at high rates over a relatively large area.

It has also been found to be useful to provide relatively small area gas inlets such that the area of the gas inlet array is largely made up of the space in-between the gas inlets rather than the area of the outlets of the gas inlets. As such, whereas it has been found to be advantageous to provide a relatively large number density of gas inlets in relation to the area of the gas inlet inlet array, it has also been found to be advantageous to provide an array in which the ratio of the area of the gas inlets divided by the area of the gas inlet array as a whole is low. It has been found that small gas inlets are advantageous for providing high velocity directed gas flows. However, it is also desired to have a relatively uniform gas flow over a relatively large area for uniform deposition of a diamond film over a relatively large area. Accordingly, a combination of relatively small gas inlet size and a relatively high number density of such gas inlets has been found to be advantageous to achieve a balance between high velocity directed gas flows and uniformity of gas flow over a relatively large area.

In light of the above findings, a first aspect of the present invention provides a microwave plasma reactor for manufacturing synthetic diamond material via chemical vapour deposition, the microwave plasma reactor comprising:
 a plasma chamber;
 a substrate holder disposed in the plasma chamber for supporting a substrate on which the synthetic diamond material is to be deposited in use;
 a microwave coupling configuration for feeding microwaves from a microwave generator into the plasma chamber; and
 a gas flow system for feeding process gases into the plasma chamber and removing them therefrom;
 wherein the gas flow system comprises a gas inlet array comprising a plurality of gas inlets disposed opposite the substrate holder for directing process gases towards the substrate holder, the gas inlet array comprising:
 at least six gas inlets disposed in a substantially parallel or divergent orientation relative to a central axis of the plasma chamber (by substantially parallel we mean at least within 10°, 5°, 2°, or 1° of a perfect parallel arrangement);
 a gas inlet number density equal to or greater than 5 gas inlets/cm$^2$, wherein the gas inlet number density is measured by projecting the gas inlets onto a plane whose normal lies parallel to the central axis of the plasma chamber and measuring the gas inlet number density on said plane; and
 a gas inlet area ratio of equal to or greater than 10, wherein the gas inlet area ratio is measured by projecting the gas inlets onto a plane whose normal lies parallel to the central axis of the plasma chamber, measuring the total area of the gas inlet area on said plane, dividing by the total number of gas inlets to give an area associated with each gas inlet, and dividing the area associated with each gas inlet by an actual area of each gas inlet,
 wherein the gas inlet number density and the gas inlet area ratio are calculated over at least 50% of all the gas inlets in the gas inlet array.

The number density and area ratio parameters can be calculated over at least a majority of the gas inlets in the gas inlet array, e.g. over at least 60%, 70%, 80%, 90%, or all of the gas inlets in the array.

Furthermore, a second aspect of the present invention provides a method of manufacturing synthetic diamond material using the microwave plasma reactor described above, the method comprising:
 injecting process gases into the plasma chamber through the plurality of gas inlets;
 feeding microwaves from a microwave generator into the plasma chamber through the microwave coupling configuration to form a plasma above a substrate disposed over the substrate holder; and
 growing synthetic diamond material on a growth surface of the substrate.

These aspects of the invention capture four key features which are advantageously provided in combination to achieve the technical benefits of the present invention: (i) a relatively high number of gas inlets (in the most simple embodiment, six gas inlets arranged in a hexagonal arrangement, but preferably many more gas inlets are provided for certain applications); (ii) the orientation of the gas inlets should be substantially parallel or divergent; (iii) the gas inlet number density should be high (at least 5 gas inlets/cm$^2$ but preferably much higher for certain applications); and (iv) the ratio of the area associated with each gas inlet relative to the actual area of each gas inlet should be high (at least 10 but preferably much higher for certain applications).

It has been found that a gas inlet array comprising these four characteristics can be utilized to form a relatively solid curtain of process gas flowing towards the substrate. By "solid" we mean that the plurality of individual gas streams are so densely packed that they may be approximated to a single uniform mass of gas flowing towards the substrate.

The solid gas stream may comprise a dense curtain of individual gas flows or an essentially continuous (in a radial direction) uniform flow of process gas. The gas inlets may be configured such that individual gas streams are aimed at the substrate but do not significantly interact with each other before the substrate to cause unwanted turbulence. While the individual gas streams may merge to form a single "plug" of gas flowing towards the substrate, the streams are not configured to significantly cross each other above the substrate. This is advantageous to provide good gas flow characteristics creating a more laminar flow of the gas streams and preventing or at least reducing turbulence.

Such an arrangement can provide a relatively uniform flow of gas over a relatively large area. Furthermore, such an arrangement can reduce gas entrainment such that the majority, or preferably substantially all, the gas flows in a direction towards the substrate and out of outlets in a base of the chamber with reduced, or preferably substantially no, gas re-circulating within the chamber. It has been found that by preventing gas entrainment, the concentration of species in the activated plasma region is more controllable by direct control of the concentration of gases injected through the gas inlets. Furthermore, by limiting the possibility of gases re-circulating within the plasma chamber, it is possible to minimize the possibility of contaminating the walls of the chamber even when relatively large area plasmas are formed. That is, a high density of closely spaced high velocity gas streams functions both to prevent any gas flowing back towards the gas inlets via convection and can also provide a relatively even distribution of pressure on the plasma discharge to flatten it in an even manner and allow the possibility for very large area, flat, even plasmas to be achievable at very high flow rates.

For example, for flat substrate configurations it is has been found to be advantageous to provide a gas inlet configuration comprising a high density of gas inlets which are oriented in a direction substantially perpendicular to the substrate so as to provide a substantially uniform curtain of gas propagating towards the substrate and impinging upon the plasma discharge disposed between the gas inlet and the substrate. Such an arrangement has been found to flatten the plasma discharge and increase the concentration of activated gas species in close proximity to the substrate surface. Furthermore, the substantially uniform curtain of gas formed by a high density of the gas inlets has been found to provide a substantially uniform deposition of reactive gas species from the plasma to the substrate via convection transport over large areas without unduly constricting the plasma in a lateral direction by angling the gas inlets inwardly as is suggested in US2010/0189924.

Further still, it has been found that providing a gas inlet array as described herein enables higher gas flow rates and operating pressures to be utilized within the plasma chamber without arcing occurring within the plasma chamber. Higher operating flow rates and pressures enable higher power densities which equates to a more reactive plasma, i.e. more atomic hydrogen is generated to facilitate increased growth rates and improved quality of CVD diamond product.

It has surprisingly been found that the usable ranges for the synthesis parameters of pressure and power density for the manufacture of synthetic CVD diamond material can be altered by changes in the gas dynamics (flow, geometry etc) for a given gas composition. Typically the upper limit for uniform diamond synthesis in terms of the parameters pressure and power is determined by the onset of mono-polar arcs. Those skilled in the art will know that this mono-polar arc limit is affected by experimental factors such as the operating frequency, pressure/power ratio and also the geometry (diameter/thickness) of the substrate.

The present inventors found it surprising that manipulating the gas flow can have a dramatic effect on increasing the operating parameter space in terms of pressure and power while simultaneously not reducing the area of CVD diamond deposition or the uniformity of said deposition. An often encountered limitation in the pressure/power parameter space for growing CVD diamond is the onset of arcing. The structural features of this invention allow growth of CVD diamond material at higher power densities and pressures than in a conventional synthesis system which might use only one axially symmetric gas inlet hole. In practise the inventors have found that the maximum pressure for operation is increased by >5%, >10%, >15%, >20%, >25%, >30%, or >35% over that which would normally be possible with alternative gas inlet geometries/flows, for example a single axially symmetric gas inlet. Furthermore this increase in operating pressure is not at any expense of uniform deposition area. For example, in the case of an operating frequency in a range 800 to 1000 MHz, uniform growth may be achieved to form a disk of CVD diamond having uniform thickness over a diameter in the range 70 to 160 mm. Thickness uniformity may be calculated by measuring the thickness of the CVD diamond disk at various points and calculating the percentage deviation from a mean thickness. For example, at least 10, 15, 17 or 20 measurement points may be taken over at least 70% of a total area of the disk. In accordance with certain embodiments of the present invention the maximum growth thickness variation may be <20%, <15%, <10%, <5%, or <2% of the mean thickness of the CVD diamond disk.

Using embodiments of the present invention it is possible to avoid the problem of arcing within the plasma chamber at operating pressures equal to or greater than: 200, 220, 240, 260, 280, 300, 320, 340, 360, 380, or 400 Torr (i.e., 26.7, 29.3, 32.0, 34.7, 37.3, 40.0, 42.7, 45.3, 48.0, 50.7, or 53.3 kPa) at a microwave frequency in a range 2300 to 2600 MHz; 120, 140 160, 180, 200, 220, 240, or 260 Torr (i.e., 16.0, 18.7, 21.3, 24.0, 26.7, 29.3, 32.0, or 34.7 kPa) at a microwave frequency in a range 800 to 1000 MHz; or 60, 70, 80, 100, 120, 140, or 150 Torr (i.e., 8.00, 9.33, 10.7, 13.3, 16.0, 18.7, or 20.0 kPa) at a microwave frequency in a range 400 to 500 MHz. The operating pressure may be equal to or less than 550, 450, 400, 350, or 300 Torr (i.e., 73.3, 60.0, 53.3, 46.7, or 40.0 kPa) depending on the specific reactor design. For example, a typical operating pressure using a gas inlet array according to certain embodiments of the present invention may be in the range 200 to 330 Torr (i.e., 26.7 to 44.0 kPa) for a microwave frequency in a range 2300 to 2600 MHz, 160 to 220 Torr (i.e., 21.3 to 29.3 kPa) for a microwave frequency in a range 800 to 1000 MHz, or 80 to 140 Torr (i.e., 10.7 to 18.7 kPa) for a microwave frequency in a range 400 to 500 MHz. Using embodiments of the present invention it has been found that it is possible to achieve a uniform stable plasma at these pressures and uniform CVD diamond growth.

Power densities which can be delivered to the substrate may be equal to or greater than 0.05, 0.1, 0.5, 1, 1.5, 2.0, 2.5, 2.75, 3.0, 3.2, or 3.5 W/mm$^2$ of the substrate growth surface. The power density may be equal to or less than 6.0, 5.0, or 4.0 W/mm$^2$ of the substrate growth surface depending on the specific reactor design. For example, a typical operating power density using a gas inlet array according to certain embodiments of the present invention may be in the range 3.0 to 4.0 W/mm$^2$ of the substrate growth surface.

In some arrangements, it has actually been found to be advantageous to angle at least some of the gas inlets outwardly in a divergent configuration to achieve more uniform diamond film formation. For example, one central gas inlet and six surrounding gas inlets which are oriented to form divergent gas streams. This arrangement has been found to be particularly useful when a non-planar substrate is utilized. In one arrangement, a convex substrate is provided with a central portion which is closer to the gas inlet arrangement than side edge portions. The divergent gas inlets are then useful to aid in pushing the plasma around towards the side edge portions of the substrate to achieve relatively uniform diamond film formation over the convex substrate. Such an arrangement is useful for forming non-planar diamond films.

While the aforementioned description specifies that at least six gas inlets may be provided to achieve more uniform diamond film formation over larger areas and/or over non-planar substrates, it has been found that for certain applications a much larger and more dense array of gas inlets is advantageous for many applications. For example, in certain applications it may be preferable to provide a gas inlet configuration comprising equal to or greater than 7, 9, 10, 15, 20, 30, 40, 60, 90, 120, 150, 200, 300, 500, 700, 1000, 1200, 1500 or more gas inlets. Particularly preferred arrangements comprise a close-packed array of gas inlets, for example, a hexagonal close-packed array of gas inlets has been found to be particularly advantageous in achieving uniform diamond film formation over large areas and at a high rate of deposition. As such, hexagonal close-packed gas inlet configurations comprising 7, 19, 37, 61, 91, 127, 169, 217, 271, 331, 397, 469, 547, 631, 721, 817, 919, 1027, 1141, 1261, 1387, 1519 or more gas inlets may provide preferable arrangements.

Embodiments of the present invention provide gas inlet configurations which ensure: a relatively even flow of process gas towards the substrate thus improving diamond film uniformity; relatively little gas entrainment compared to the gas flow through the gas inlets thus improving control of plasma chemistry; the possibility of plasma formation outside a region of interest near the substrate for diamond film formation is lowered; the possibility of plasma punch-through is lowered thus allowing higher velocities of gas flow and thus an increased rate of uniform diamond film formation over potentially larger areas; the gas inlets are adapted to provide directed gas flow streams at high gas flow velocities and suitable operating pressures; the possibility of reactive species flowing towards the walls of the reactor by diffusion or convection is lowered thus lowering contamination during use and improving diamond film purity; and higher gas flow rates and operating pressures can be utilized without arcing occurring within the plasma chamber, enabling higher power densities to be achieved facilitating increased growth rates and improved quality of CVD diamond product.

In addition to the above, it has been surprisingly found that incorporation of dopants such as nitrogen, boron, silicon, phosphorous and other defects such as dangling bonds and vacancy clusters are very sensitive to total gas flow and geometry of gas flow. It has been found that the provision of a gas inlet arrangement as previously described enables uniform doping to be achieved over larger areas of polycrystalline diamond material and/or over a larger number of single crystal diamonds grown in a single growth run.

BRIEF DESCRIPTION OF THE DRAWINGS

For a better understanding of the present invention and to show how the same may be carried into effect, embodiments of the present invention will now be described by way of example only with reference to the accompanying drawings, in which.

DETAILED DESCRIPTION OF CERTAIN EMBODIMENTS

Figure 1:
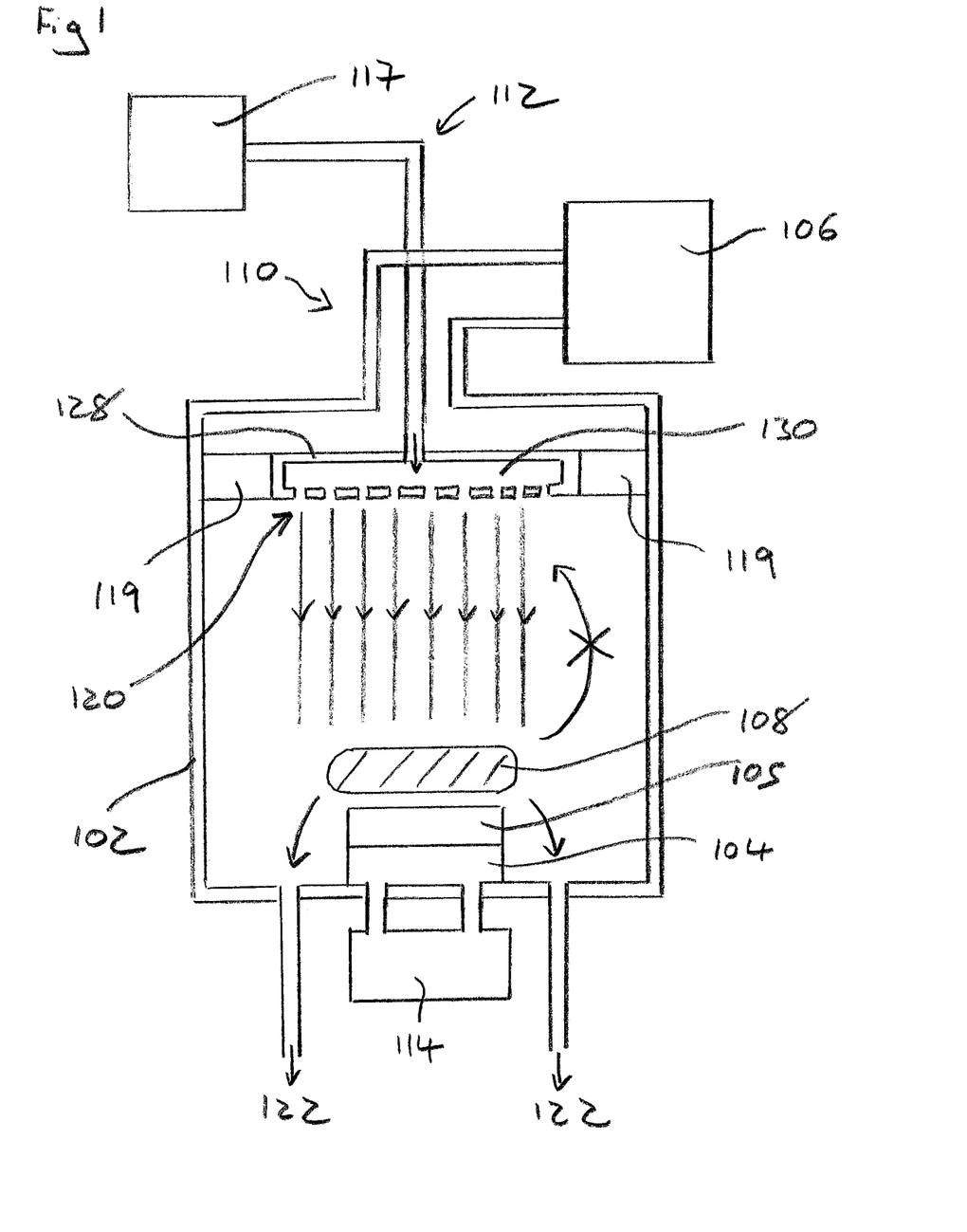
FIG. 1 shows a vertical cross-sectional view of a microwave plasma reactor configured to deposit a diamond film using a chemical vapour deposition technique in accordance with an embodiment of the present invention.
Figure 2:
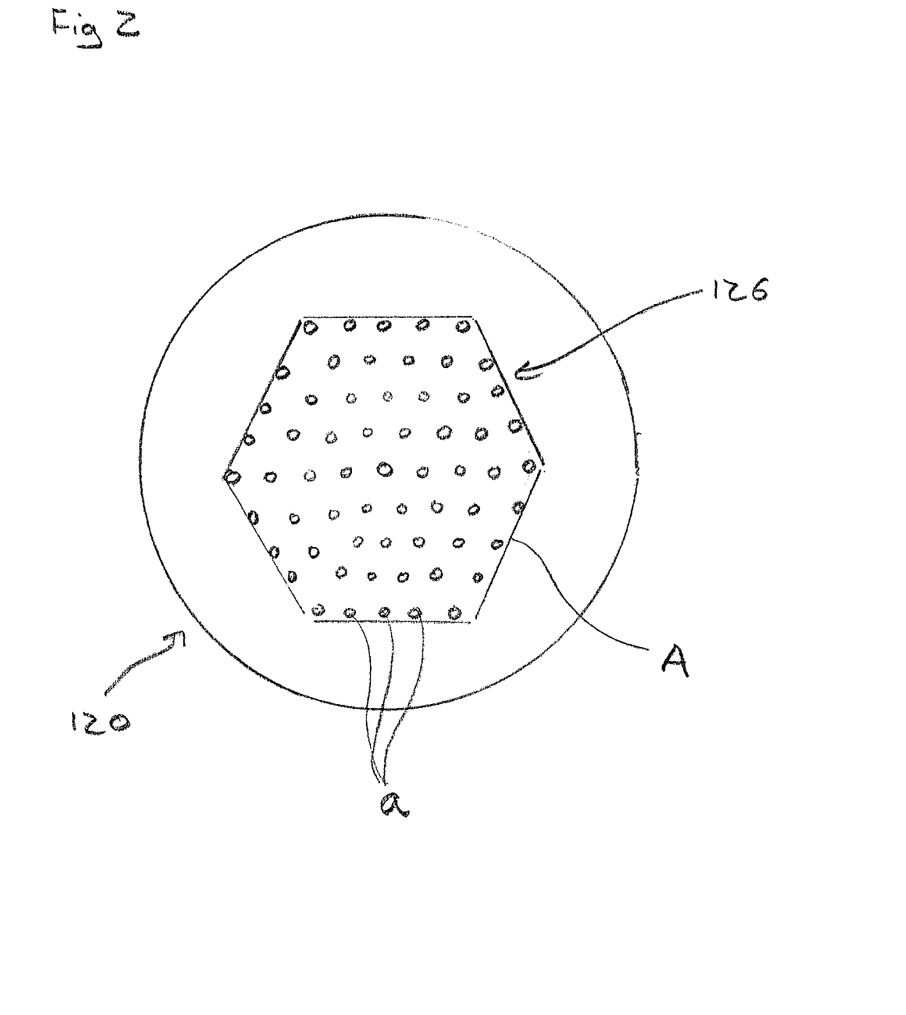
FIG. 2 shows a plan view of a gas inlet array according to an embodiment of the present invention.
Figure 3:
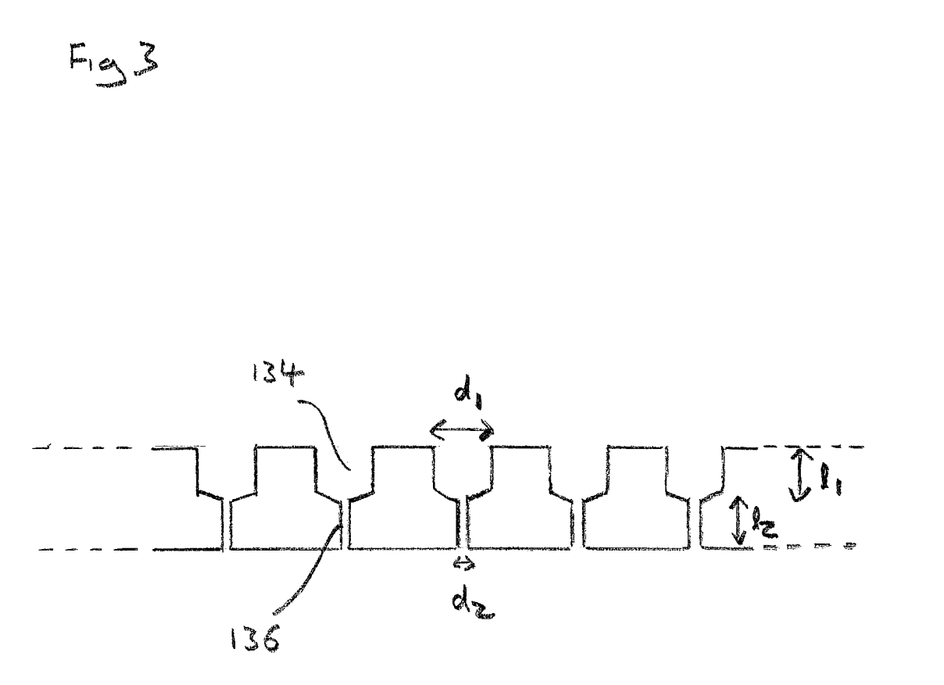
FIG. 3 shows a vertical cross-sectional view of a portion of the gas inlet array illustrated in FIGS. 1 and 2.

FIGS. 1 to 3 show various views of a microwave plasma reactor according to an embodiment of the present invention.

As can be seen by reference to FIG. 1, the microwave plasma reactor comprises the following basic components: a plasma chamber 102; a substrate holder 104 disposed in the plasma chamber for holding a substrate 105; a microwave generator 106 for forming a plasma 108 within the plasma chamber 102; a microwave coupling configuration 110 for feeding microwaves from the microwave generator 106 into the plasma chamber 102 via a coaxial waveguide and through an annular dielectric window 119; a gas flow system 112, 122 for feeding process gases into the plasma chamber 102 and removing them therefrom; and a substrate coolant system 114 for controlling the temperature of a substrate 105.

It is found that this invention is best utilized in conjunction with simple modal synthesis chambers, for instance the $TM_{011}$ mode is advantageous as it has been found to be the most compact (small) mode which can be practicably used in a diamond CVD plasma reactor. Its compactness means that the impact of gas flow aspects on the near gas phase chemistry are maximized, however, this invention is not limited to this modal geometry. The use of a small plasma chamber having a compact microwave cavity is made possible by the flow characteristics of the gas inlet array according to embodiments of the present invention which ensures that process gas flows through a central portion of the plasma chamber without undue circulation of gases within the plasma chamber contaminating walls of the chamber which will be relatively close to the gas flow in a compact cavity arrangement.

The gas inlets may be formed by a portion of the microwave/vacuum wall such that the gas inlets form part of the microwave cavity wall of the plasma chamber, rather than being outside the mesh that defines the microwave cavity wall.

The flow characteristics of embodiments of the present invention also allow the plasma reactor to be operated at high power while constraining the plasma to avoid damaging the walls of the chamber and/or the microwave window. The high velocity, highly uniform gas flow within the plasma chamber achieved by embodiments of the present invention allows more power to be introduced at high pressures without the plasma arcing. The power delivered to the substrate also increases with high velocity, highly uniform gas flow, increasing efficiency. That is, a fraction of the total power which is delivered to a substrate is increased. Typically this invention enables at least 45%, 50%, 55%, 60%, 65%, or 70% of power fed into the plasma chamber to be transmitted through the base of the chamber (opposite to the gas inlet). It has been found that the power transmitted through the base of the chamber approximately equates to hydrogen flux towards the base of the chamber. Accordingly, increasing the power fed through the base of the chamber increases the hydrogen flux to the substrate over the base of the chamber which leads to better quality diamond material being formed over the substrate. It has also been found that utilizing high axial gas flows helps improve the stability of the plasma, leading to more uniform deposition in terms of both growth thickness and quality.

The gas flow system 112 comprises source gas containers 117 and a gas inlet array 120 coupled to the source gas containers and positioned in a top portion of the plasma chamber 102 axially disposed above the substrate holder 104 and substrate 105 for directing process gases towards the substrate 105 in use. In the illustrated embodiment the process gas is fed from the source gas containers 117 to the gas inlet array through a central conductor of the microwave coupling configuration 110. However, other configurations are also possible for feeding the process gases to the gas inlet array 120.

The microwave window 119 for feeding microwaves from the microwave generator into the plasma chamber is preferably disposed at an opposite end of the plasma chamber to the substrate holder. Furthermore, the plurality of gas inlets are preferably disposed closer to the substrate holder than the microwave window. Such an arrangement can minimize the possibility of the microwave window being contaminated with process gases while also ensuring that the process gas is injected at a location relatively close to the substrate.

One or more gas outlets 122 are provided in a base of the plasma chamber 102. The gas outlets 122 are preferably located in a ring around the substrate holder 104 and most preferably form a uniformly spaced array around the substrate holder 104 to enhance continuous gas flow from the gas inlet array 120 towards the substrate 105, around the substrate 105, and out of the gas outlets 122 while minimizing turbulence and gas recirculation back up the plasma chamber 102. For example, it may be preferable to provide at least 6, 12, 18, or 30 gas outlets disposed around the substrate holder 104, preferably in a uniformly spaced array. In this regard, it should be noted that while embodiments of the present invention may function to reduce uncontrolled gas re-circulation within the plasma chamber, this does not preclude the possibility of using a controlled gas re-circulation system outside the plasma chamber for re-using process gas which is extracted from the plasma chamber through the gas outlets.

It should be noted that while terms such as "top portion" and "base" are used in this specification when describing the plasma reactor, it is possible to invert the reactor so that in use the gas flow is in an upwards direction. As such, the terms "top portion" and "base" refer to the location of the reactor components relative to each other and not necessarily their location relative to the earth. In standard usage, the gas flow will be in a downwards direction such that the gas streams from the gas inlet array flow downwards with gravity. However, it is possible to invert the reactor such that the gas streams from the gas inlet array flow upwards against gravity. In the inverted orientation the gas flow will be parallel to principle thermally driven convection currents (which are in an upwards direction due to the large amount of heat generated in the plasma which is below the substrate in an inverted arrangement). This inverted arrangement may have some benefits for certain applications.

It should also be noted that while the microwave plasma reactor illustrated in FIG. 1 has a separate substrate holder disposed in the plasma chamber, the substrate holder may be formed by the base of the plasma chamber. The use of the term "substrate holder" is intended to cover such variations. Furthermore, the substrate holder may comprise a flat supporting surface which is the same diameter (as illustrated) or larger than the substrate. For example, the substrate holder may form a large flat surface, formed by the chamber base or a separate component disposed over the chamber base, and the substrate may be carefully positioned on a central region of the flat supporting surface. In one arrangement, the flat supporting surface may have further elements, for example projections or grooves, to align, and optionally hold, the substrate. Alternatively, no such additional elements may be provided such that the substrate holder merely provides a flat supporting surface over which the substrate is disposed.

The gas inlet array 120 comprises a plurality of gas inlets disposed opposite the substrate holder 104 for directing process gases towards the substrate holder 104. The gas inlet array 120 comprises a plurality of gas inlets disposed in a substantially parallel orientation relative to the central axis of the plasma chamber 102. The gas inlet array 120 also comprises a housing 128 defining a cavity 130 for receiving process gases from one or more gas inlet pipes. The housing 128 also defines the plurality of gas inlets for injecting process gases from the cavity 130 into the plasma chamber 102 and towards the substrate holder 104. For example, the housing may comprise metallic walls in which the gas inlets are integrally formed.

The housing 128 and cavity 130 can function as a mixing chamber for mixing source gases prior to injection into the plasma chamber. Such a pre-mixing chamber has found to be useful to ensure efficient gas mixing prior to injection into the plasma chamber. Furthermore, a pre-mixing chamber is useful to ensure that there is a uniform gas flow over the entirety of the array of gas inlets. The pre-mixing chamber may include a diffuser or an array of holes disposed prior to the gas inlet array to encourage gas mixing and/or provide an even flow of gas to the gas inlet array.

The housing 128 can also extend into the plasma chamber allowing gases to be injected closer to the substrate. The distance between the gas inlet array and the substrate where diamond growth occurs affects the thickness of a boundary layer over the substrate. Reducing the distance between the gas inlet array and the substrate had been found to reduce the thickness of such a boundary layer and lead to an increase in diamond deposition rate.

A variety of modifications to the gas inlet array may be envisaged. For example, the gas inlet array may be configured to transport different gas compositions though different gas inlets. Furthermore, the plurality of gas inlets may have a non-uniform spacing and/or comprise non-uniform gas inlet diameters. This may be advantageous as different gases will have different flow characteristics and so each of the gas inlets, or a group of gas inlets, can be optimized for injection of a particular source gas. In this case, the mixing cavity should be segregated to prevent mixing of source gases and configured to direct each source gas to one or more gas inlets which have been specifically adapted for injecting the associated source gas.

A further alternative to the provision of a metallic housing in which the gas inlets are integrally formed is to form the gas inlets in a microwave window which extends over a central region in an upper portion of the plasma chamber or even located closer to the substrate in a central portion of the plasma chamber. For example, the microwaves may be coupled into the chamber via a plate of microwave window material (e.g. quartz) in which the gas inlets are integrally formed. In such an arrangement, the high velocity laminar flow produced by a gas inlet array according to embodiments of the present invention will aid in keeping the plasma away from the microwave window. Using high gas flows will result in less contaminants being deposited near the gas inlets and the microwave window therefore reducing the problem of contaminants falling onto the substrate and causing problems such as black spots, silicon incorporation, inclusions, and nuclei for defect formation in the CVD diamond material.

FIG. 2 shows a plan view of the gas inlet array 120. The array comprises a hexagonal close-packed array of gas inlets 126. The array comprises a gas inlet number density greater than 5 gas inlets/cm$^2$, wherein the gas inlet number density is measured by projecting the gas inlets onto a plane whose normal lies parallel to a central axis of the plasma chamber and measuring the gas inlet number density on said plane. The gas inlet number density is measured in this way because the array may not necessarily be disposed in a plane. For example, the array may be disposed in a wall which is curved or otherwise angled relative to a plane whose normal lies parallel to a central axis of the plasma chamber. However, in the illustrated embodiment it will be noted that the array is disposed in a plane whose normal lies parallel to a central axis of the plasma chamber.

The gas inlet array 120 may have a gas inlet area ratio much greater than 10, wherein the gas inlet area ratio is measured by projecting the gas inlets onto a plane whose normal lies parallel to a central axis of the plasma chamber, measuring the total area A of the gas inlet array on said plane, dividing by the total number of gas inlets to give an area associated with each gas inlet, and dividing the area associated with each gas inlet by an actual area of a gas inlet a. Where the gas inlets have different areas an average gas inlet area can be used for the area a. If the total area A of the gas inlet array is delineated by a line passing through the centre of each of the gas inlets in an outer ring of gas inlets in the array, it will be noted that half the area associated with the outer ring of gas inlets will be outside this area. This can be corrected for by dividing the number of gas inlets in the outer ring by two when calculating the total number of gas inlets and then using this corrected value in the aforementioned calculation so as to correctly calculate the area associated with each gas inlet. The actual area of each gas inlet may be calculated as an average gas inlet area by summing the actual area of every gas inlet in the array and dividing by the total number of gas inlets in the array. Alternatively, if all the gas inlets have the same area then the area of a single gas inlet may be used for the actual area of each gas inlet.

Each gas inlet 126 may have an outlet diameter in the range 0.1 mm to 5 mm, 0.2 mm to 3.0 mm, 2.0 mm to 3 mm, 0.2 mm to 2 mm, 0.25 mm to 2 mm, or 0.25 mm to 1.5 mm. The diameter of the gas inlets may be configured to achieve good laminar flow of the individual gas streams injected through and out of the gas inlets into the plasma chamber 102. The dimensions of the gas inlets 126 also affect the Reynolds number $R_e$ for gas injection. The Reynolds number is a dimensionless number that gives a measure of the ratio of inertial forces to viscous forces acting in a gas stream and consequently quantifies the relative importance of these two types of forces for given flow conditions. The Reynolds number may be used to characterize different flow regimes, such as laminar or turbulent flow. Laminar flow occurs at low Reynolds numbers, where viscous forces are dominant, and is characterized by smooth, constant fluid motion, while turbulent flow occurs at high Reynolds numbers and is dominated by inertial forces, which tend to produce chaotic eddies, vortices and other flow instabilities. In accordance with certain embodiments of the present invention it is preferable to operate at low Reynolds number to minimize turbulence. The effect of providing an array of smaller gas inlets compared to a small number of larger ones is to decrease the Reynolds number (if the mean velocity of the gas stream is maintained). This reduces the "inertial" component of gas injection, in comparison to the viscous forces operating. Accordingly, it is preferred that the dimensions of the gas inlets 126 are selected to give a Reynolds number for gas injection equal to or less than 100, 80, 50, 30, 20, 10, 5, 3, 2, or 1. In practice, the Reynolds number may be equal to or greater than 0.1. A typical operating range for the Reynolds number may lie in the range 1 to 20 depending on the specific gas inlet array which is utilized.

FIG. 3 shows a vertical cross-sectional view of a portion of the gas inlet array 120 shown in FIGS. 1 and 2. In the illustrated arrangement, each gas inlet 126 has an inlet portion 134 having a first diameter $d_1$ and an outlet portion 136 having a second diameter $d_2$, the first diameter $d_1$ being larger than the second diameter $d_2$. Such an arrangement can be advantageous as the fine bore of the outlet portion which is advantageous for operating in a low Reynolds number regime is only required to be formed at a minimum length for achieving good gas flow characteristics. As such, for a wall thickness which is larger than a minimum length required for achieving good gas flow characteristics, the remainder of the wall thickness can be drilled out at a larger diameter. For example, the inlet portion 134 may have a length $l_1$ and the outlet portion 136 may have a length $l_2$ with the sum of $l_1$ and $l_2$ being equal to a wall thickness. Furthermore, this design aids in achieving clean laminar flow as a converging gas inlet profile causes a parabolic velocity profile to develop more quickly. Of course, it is also possible to provide a gas inlet in a wall portion of the gas inlet array which consists only of a single continuous bore which may have a constant diameter along its length or a continuously varying taper.

The present invention has thus far been described with reference to an embodiment as illustrated in FIGS. 1 to 3. However, it is envisaged that various modification can be made within the scope of the invention. For example, certain embodiments of the present invention may conform to one or more general design principles for an array of gas inlets as discussed below.

Each gas inlet in the array can be characterised by its lateral spacing (radius) away from a central axis of the plasma chamber. A central gas inlet, if it exists, may be disposed down a central axis of the plasma chamber. Gas inlets at the same radius (lying on a ring centred on the central axis) may show periodic rotational symmetry around the central gas inlet, although the rotational angle may vary for different rings of gas inlets.

Gas inlets positioned at a particular radius from the central axis may be parallel to the central axis, or may be divergent from it. The gas inlets at any particular radius may be at least as divergent as any gas inlets lying on a smaller radius. That is not to say that a minority of gas inlets which do not follow this principle, or even are directed at a convergent angle, are not permitted.

The gas inlets may all be retained parallel to the central axis until some radius $R_p$, and then start to become divergent out to a maximum radius on which the gas inlets are placed, $R_m$. In the region between $R_p$ and $R_m$, the divergence of the gas inlets may vary as a function of the radius, or the angle of divergence may be fixed.

The spacing of the gas inlets may be uniform across the surface through which they emerge. Preferably the gas inlets are in a consistent geometric arrangement, most preferably in a hexagonal array. While not being bound by theory, it is believed that such arrangements are advantageous as the gas jets from individual gas inlets converge such that their velocity profiles are well matched. This allows the gas jets to converge with little or no disturbance. Alternatively, the spacing of the gas inlets may increase with radius, such that the density of gas inlets reduces towards the outer edge of the array. The gas inlets may be arranged in discrete rings, with little obvious correlation in the position of gas inlets lying in adjacent rings. It is indeed possible to have a random array of gas inlets which provides some reasonably uniform average density of gas inlets to perform an adequate performance and realise some of the benefits of this invention, although the best arrangement is one of a regular array.

The diameter of each gas inlet is optionally the same, particularly for large gas inlet arrays (e.g. greater than 100 gas inlets), or at least particularly for the majority of the gas inlets in such an array (e.g. at least 50%, 60%, 70%, 80%, or 90% of the gas inlets have the same diameter).

Projecting all the gas inlets onto a plane whose normal lies parallel to the central axis, the density of gas inlets in the gas inlet array, particularly for large gas inlet arrays (e.g. greater than 100 gas inlets), given in gas inlets/cm$^2$, is equal to or greater than 5, preferably equal to or greater than 10, and equal to or less than 100, 50, or 10.

Projecting all the gas inlets onto a plane whose normal lies parallel to the central axis, the total area of the gas inlets in the array (that is the sum of the areas of each outlet of the gas inlets in the array), given in mm$^2$, may be in a range 1 to 5000, 5 to 3000, 10 to 3000, 20 to 2750, 30 to 2750, or 50 to 2700. The total area of the array over which the gas inlets are spaced, given in mm$^2$, may be in a range 100 to 15000, 200 to 15000, 400 to 10000, 800 to 10000, or 1000 to 8000. The actual total area of the gas inlets and the total area of the array will depend on the number of gas inlets provided in the array and the area over which they are distributed, which will also be dependent on the area of CVD diamond to be grown. For example, a simple six gas inlet array may have a gas inlet diameter in the range 2 to 3 mm, a total gas inlet area of 20 to 50 mm$^2$, and a total array area of approximately 450 mm$^2$. In contrast, a 91 gas inlet array may have a gas inlet diameter of approximately 0.5 mm, a total gas inlet area of approximately 18 mm$^2$, and a total array area of approximately 1000 mm$^2$. Further still, a 1519 gas inlet array may have a gas inlet diameter in the range 0.25 to 1.5 mm, a total gas inlet area of 75 to 2700 mm$^2$, and a total array area of approximately 8000 mm$^2$.

A ratio of the total gas inlet area/area of the gas inlet array should preferably be relatively low, for example, equal to or less than 0.5, 0.35, 0.3, 0.2, 0.1, 0.05, 0.02, 0.01, or 0.007. The ratio of the total gas inlet area/area of the gas inlet array may be equal to or greater than 0.001, 0.004, 0.007, 0.01, or 0.02. The actual ratio provided will depend on the number of gas inlets provided in the array and the area over which CVD diamond is to be grown. For example, a simple six gas inlet array may have a ratio in the range 0.05 to 0.1, a nine gas inlet array may have a ratio of approximately 0.007, a 721 gas inlet array may have a ratio in the range 0.004 to 0.2, and a 1519 gas inlet array may have a ratio in the range 0.01 to 0.35.

A ratio of the area of the gas inlet array to an array of the growth surface of the substrate may be in the range 0.05 to 2, 0.1 to 1.5, 0.5 to 1.25, 0.8 to 1.1, or 0.9 to 1.1. For arrays which comprise a large number of gas inlets (e.g. greater than 100, 500, or 1000), the area of the array may be set to be substantially equal to the area of the growth surface. For arrays which have a lower number of gas inlets, the area of the array is preferably less than the area of the growth surface of the substrate.

Projecting all the gas inlets onto a plane whose normal lies parallel to the central axis, the total area of the gas inlet array, $\pi(R_m)^2$, divided by the total number of gas inlets gives the area associated with each gas inlet. A ratio of the associated area of each gas inlet divided by an actual area of each gas inlet is preferably equal to or greater than 10, 30, 100, 300, 1000, or 3000 and equal to or less than 100000, 30000, or 10000.

The total gas flow fed through the gas inlet array may be equal to or greater than 500, 750, 1000, 2000, 5000, 10000, 15000, 20000, 25000, 30000, 35000, or 40000 standard cm$^3$ per minute. The total gas flow fed through the gas inlet array may be equal to or less than 60000, 50000, 30000, 20000, or 10000 standard cm$^3$ per minute depending on the specific gas inlet array which is utilized. For example, for certain gas inlet arrays a typical operating flow rate may lie in a range 500 to 40000, 1000 to 40000, or 2500 to 40000 standard cm$^3$ per minute depending on the desired growth rate and substrate area.

The total gas flow fed through the gas inlet array is preferably equal to or greater than 3, 10, 20, 50, 100, 200, 500, or 1000 standard cm$^3$ per minute per cm$^2$ of the substrate area (i.e. growth surface area of the substrate) and equal to or less than 50000, 20000, 10000, or 5000 standard cm$^3$ per minute per cm$^2$ of the substrate area. The substrate area may be defined as the useful deposition area, with radius $R_s$ achieved in the reactor. This may correspond to a substrate (e.g. for polycrystalline diamond growth over a single substrate) or a substrate carrier (e.g. for single crystal diamond growth where the substrate carrier comprises a plurality of individual substrates) or the diameter of a table on which individual substrates may be placed (e.g. for coating loose components).

Each gas inlet is preferably of a sufficiently large diameter to allow sufficient gas flow volumes at reasonable operating pressures. Accordingly, the gas inlets should not be made too small and this size limitation will limit the density of gas inlets which can be provided over the area of the gas inlet array. Conversely, each gas inlet should be made small enough to achieve a highly directed gas stream with good flow characteristics. As such, the diameter of each gas inlet is preferably in the range 0.1 mm to 5 mm, 0.2 mm to 3.0 mm, 2.0 mm to 3 mm, 0.2 mm to 2 mm, 0.25 mm to 2 mm, or 0.25 mm to 1.5 mm.

The array of gas inlets is preferably formed into a surface which itself is rotationally symmetric around the central axis of the chamber. This surface may be planar, or it may curve, preferably in some smoothly varying manner. Preferably it is planar, particularly for large gas inlet arrays (e.g. greater than 100 gas inlets), or at least particularly for the majority (greater than 50% of) the gas inlets in such an array.

The surface in which the gas inlets lie is preferably reasonably close to the substrate, with a distance $D_c$ from the central gas inlet (or where the central axis intersects the plane of the first ring of gas inlets) which is less than or equal to $6R_s$, $4R_s$, or $2R_s$, where $R_s$ is the radius of the substrate or the substrate holder. Preferably the central gas inlet, or a plane defining the first ring of gas inlets, is at least as close, or in some arrangements preferably closer, to the substrate as the plane defined by the next ring of gas inlets out from the central axis. Optionally, the plane defining the outer ring of gas inlets is also no more than $6R_s$, $4R_s$, or $2R_s$ from the substrate.

The arrangement of gas inlets can be thought to fit into one of three example configurations as discussed below, although in practice the three example configurations all lay along a continuous spectrum of possible configurations.

A first example configuration is one which comprises at least seven gas inlets, comprising at least one centre gas inlet (more particularly only one) and disposed around these at least six gas inlets (more particularly six gas inlets), where the surrounding six gas inlets form a rotationally symmetric pattern and are either parallel to or divergent from (more particularly are divergent from) the central axis of the chamber. This configuration seeks to obtain the benefits of providing a plurality of gas inlets in accordance with the present invention, while limiting to a relatively low number of gas inlets, simplifying the fabrication of the gas inlet array and simplifying use of additional elements such as interchangeable gas inlet bores to vary the gas inlet diameter for different applications and flow rates. The technique can achieve substantially higher uniformity in deposition than a single gas inlet, particularly in relation to processes involving doping with boron.

A second example configuration comprises a central disc of gas inlets which are all essentially parallel to the central axis of the plasma chamber and disposed in some regular array out to a radius $R_p$, outside of which are one or more rings of increasingly divergent gas inlets to 'soften' the edge of the gas inlet array. This configuration seeks to achieve a balance of the benefits from the example discussed above and the example discussed below.

A third example configuration is one in which $R_p = R_m$ and all, or substantially all, of the gas inlets are parallel to the central axis. Ideally the gas inlets lie in a close packed hexagonal array, and the maximum radius of the gas inlet array $R_m$ meets the criteria $R_m \times F_m$ is greater than or equal to $R_s$, where $F_m$ is preferably equal to or greater than 0.5, 0.6, 0.7, 0.8, 0.9, or 1 and preferably equal to or less than 1.5, 1.3, 1.2, or 1.1. This configuration provides a dense column of flow from the surface containing the gas inlets to the substrate, and which covers the entire substrate, and which permits essentially no intermixing of the existing gases in the chamber such that whilst there may be some convective currents in the peripheral regions of the chamber the substrate only sees gases which have just been injected ('fresh' gases).

The aforementioned design criteria may provide one or more advantages for certain applications as discussed below.

The position and uniformity of the plasma with respect to the substrate can easily be optimised by optimising the total flow. The solid gas stream of process gas towards the substrate can apply a substantially uniform 'pressure' across the plasma region.

Due to minimal gas flow outside of the solid gas stream between the gas inlet array and the substrate, wall contaminants do not enter the depositing gas stream, so that the purity of the deposited diamond is essentially independent of any wall contaminants. This reduces spurious contaminants such as silicon and nitrogen which may originate from the wall or other surfaces in the reactor. This also enables deposition of high purity boron free layers in systems previously used for boron doping thus, for example, enabling continuous deposition of boron containing and then boron free layers. This also enables extreme isotope control, again enabling layers of different isotopic compositions to be precisely deposited in either a continuous process or in discrete processes.

Furthermore, the solid gas stream ensures that no activated gases re-circulate within the plasma chamber and come into contact with the surface comprising the gas inlets, so that this surface stays free of deposits. This avoids any risk of such deposits breaking free and being pushed onto the substrate, which can be a source of defective growth. Further still, minimizing gas re-circulation within the plasma chamber by providing a solid gas flow of densely packed gas streams enables the gas inlets to be formed in a material which may be eroded by the plasma activated species, such as a quartz plate, without the plate becoming eroded or coated. Such a quartz plate providing the gas inlets may also be used as the entry point into the cavity of the microwave power, with its performance undiminished by the formation of coatings. Alternatively it is advantageous for the end of the microwave cavity in which the gases are introduced through the gas inlets to be proximal to the region where the microwaves are introduced, with the substrate in the distal region of the cavity.

The provision of a gas inlet arrangement as previously described also enables uniform doping to be achieved over large areas of, for example, polycrystalline diamond material and/or over a large number of single crystal diamonds grown in a single growth run. Furthermore, the gas inlet arrangement as previously described has also been found to be advantageous for achieving very high levels of doping such as high boron doping concentrations for electronic and sensor applications. The present inventors found that prior art apparatus and methods, while being suitable for achieving uniform boron doping over small areas, were deficient in achieving uniform doping over larger areas. Investigating this problem, the present inventors have surprisingly found that incorporation of dopants such as boron is very sensitive to total gas flow and geometry of gas flow and that uniform doping and/or high levels of doping could only be achieved using the gas inlet arrangements as described here.

For example, a gas inlet arrangement as described herein allows the total gas flow to be increased which has been found to increase the total boron incorporation measured in the solid. Furthermore, it has been found that adding boron from a side orifice leads to very poor boron uniformity in comparison with axial injection. Resistivity maps indicate that embodiments of the present invention are superior in achieving boron uniformity. Similar comments apply for other dopants such as nitrogen, silicon and phosphorus.

Embodiments of the present invention have thus been able to achieve uniform and consistent product at high growth rates and over large areas. Furthermore, embodiments of the present invention have enabled the synthesis of products which have not been possible to produce using prior art methods such as high boron concentration single crystal diamonds, particularly {100} oriented single crystal material.

Embodiments of the present invention improve uniformity in a CVD diamond growth process. Improvement in uniformity can be measured by one or more of the following parameters: thickness uniformity of a CVD diamond film (across the deposition area as defined by $R_s$); uniformity of one or more quality parameters of the diamond material (e.g. colour, optical properties, electronic properties, nitrogen uptake, boron uptake, and/or boron activation level); in polycrystalline diamond material, uniformity of texture, surface morphology, grain size, etc . . . ; or in single crystal diamond material where growth takes place on an array of single crystal diamond substrates on a substrate carrier, uniformity of thickness, morphology, edge twinning, lateral growth, etc . . . , between each single crystal.

The key parameters chosen for assessing uniformity depend on the synthesis process, the economics of fabricating the final product from the synthesis product, and the requirements of the final product itself. For example, for an array of single crystal diamonds, consistent morphology between adjacent crystals enabling efficient material utilisation may be more important than minor variations in colour, particularly when the material is used in cutting applications. Conversely, in boron doped material the uniformity of boron uptake may be the critical factor. The behaviour of boron in a synthesis reactor is of note here. The tendency is for boron containing gases to deplete rapidly to adjacent surfaces once the gas is broken down. Accordingly, achieving uniformity in boron incorporation in a diamond film is quite different to achieving uniformity in growth rate or morphology in intrinsic diamond where depletion of carbon containing species occurs much less quickly.

While this invention has been particularly shown and described with reference to preferred embodiments, it will be understood to those skilled in the art that various changes in form and detail may be made without departing from the scope of the invention as defined by the appendant claims.

The invention claimed is:

1. A synthetic diamond material manufacturing microwave plasma reactor comprising:
   a plasma chamber;
   a substrate holder disposed in the plasma chamber for supporting a substrate on which the synthetic diamond material is to be deposited in use;
   a microwave coupling configuration for feeding microwaves from a microwave generator into the plasma chamber; and
   a gas flow system for feeding synthetic diamond-forming process gases into the plasma chamber and removing them therefrom;
   wherein the gas flow system comprises a gas inlet array comprising a plurality of gas inlets disposed opposite the substrate holder for directing process gases towards the substrate holder, the gas inlet array comprising:
      at least six gas inlets disposed in a substantially parallel orientation relative to a central axis of the plasma chamber;
      a gas inlet number density equal to or greater than 0.1 has inlets/cm$^2$ and equal to or less than 100 gas inlets/cm$^2$, wherein the gas inlet number density is measured by projecting the gas inlets onto a plane whose normal lies parallel to the central axis of the plasma chamber and measuring the gas inlet number density on said plane; and
      a gas inlet area ratio of equal to or greater than 300, wherein the gas inlet area ratio is measured by projecting the gas inlets onto a plane whose normal lies parallel to the central axis of the plasma chamber, measuring the total area of the gas inlet array on said plane, dividing by the total number of gas inlets to give an area associated with each gas inlet, and dividing the area associated with each gas inlet by an actual area of each gas inlet,
   wherein the gas inlet number density and the gas inlet area ratio are calculated over at least 50% of all the gas inlets in the gas inlet array,
   wherein a maximum radius of the gas inlet array $R_m$ meets the criteria: $R_m \times F_m$ is greater than or equal to $R_s$, where $R_s$ is a radius of the substrate holder and $F_m$ is equal to or greater than 0.5 and equal to or less than 1.5; and
   wherein the microwave coupling configuration for feeding microwaves from the microwave generator into the plasma chamber is disposed at an end of the plasma chamber upstream of the substrate holder, wherein the gas inlet array is disposed in a central region of said end and the microwave coupling configuration comprises a dielectric microwave window disposed in a ring around the gas inlet array.

2. A synthetic diamond material manufacturing plasma reactor according to claim 1, wherein the gas inlet number density is equal to or greater than 10 gas inlets/cm$^2$.

3. A synthetic diamond material manufacturing plasma reactor according to claim 1, wherein the gas inlet number density is equal to or less than 50 or 10 gas inlets/cm$^2$.

4. A synthetic diamond material manufacturing plasma reactor according to claim 1, wherein the gas inlet area ratio is equal to or greater than 1000 or 3000.

5. A synthetic diamond material manufacturing plasma reactor according to claim 1, wherein the gas inlet area ratio is equal to or less than 100000, 30000, or 10000.

6. A synthetic diamond material manufacturing plasma reactor according to claim 1, wherein the gas inlet array comprises equal to or greater than 7, 9, 10, 15, 20, 30, 40, 60, 90, 120, 150, 200, 300, 500, 700, 1000, 1200, 1500 gas inlets.

7. A synthetic diamond material manufacturing plasma reactor according to claim 1, wherein each gas inlet has an outlet diameter in the range 0.1 mm to 5 mm, 0.2 mm to 3.0 mm, 2.0 mm to 3 mm, 0.2 mm to 2 mm, 0.25 mm to 2 mm, or 0.25 mm to 1.5 mm.

8. A synthetic diamond material manufacturing plasma reactor according to claim 1, wherein a ratio of total gas inlet area/area of the gas inlet array is equal to or less than 0.5, 0.35, 0.3, 0.2, 0.1, 0.05, 0.02, 0.01, or 0.007.

9. A synthetic diamond material manufacturing plasma reactor according to claim 1, wherein a total area of gas inlets in the gas inlet array, given in mm$^2$, is in a range 1 to 5000, 5 to 3000, 10 to 3000, 20 to 2750, 30 to 2750, or 50 to 2700.

10. A synthetic diamond material manufacturing plasma reactor according to claim 1, wherein a total area of the gas inlet array over which the gas inlets are spaced, given in mm$^2$, is in a range 100 to 15000, 200 to 15000, 400 to 10000, 800 to 10000, or 1000 to 8000.

11. A synthetic diamond material manufacturing plasma reactor according to claim 1, wherein a minimum distance $D_c$ between the gas inlet array and the substrate holder is less than or equal to $6R_s$, $4R_s$, or $2R_s$, where $R_s$ is a radius of the substrate holder.

12. A synthetic diamond material manufacturing plasma reactor according to claim 1, wherein $F_m$ is equal to or greater than 0.6, 0.7, 0.8, 0.9, or 1 and equal to or less than 1.3, 1.2, or 1.1.

13. A synthetic diamond material manufacturing plasma reactor according to claim 1, wherein each gas inlet has an inlet portion having a first diameter and an outlet portion having a second diameter, the first diameter being larger than the second diameter.

14. A method of manufacturing synthetic diamond material using the synthetic diamond material manufacturing plasma reactor according to claim 1, the method comprising:
   injecting synthetic diamond-forming process gases into the plasma chamber through the plurality of gas inlets;
   feeding microwaves from a microwave generator into the plasma chamber through the microwave coupling configuration to form a plasma above a substrate disposed over the substrate holder; and growing synthetic diamond material on a growth surface of the substrate.

15. A synthetic diamond material manufacturing plasma reactor according to claim 1, wherein the gas inlet array has an operating flow rate of from 2500 to 40,000 standard $cm^3$ per minute.

16. A method of manufacturing synthetic diamond material according to claim 14, wherein the plurality of gas inlets forming a gas inlet array has an operating flow rate of from 2500 to 40,000 standard $cm^3$ per minute.

\* \* \* \* \*

UNITED STATES PATENT AND TRADEMARK OFFICE
CERTIFICATE OF CORRECTION

| | | |
|---|---|---|
| PATENT NO. | : 11,371,147 B2 | |
| APPLICATION NO. | : 13/994903 | |
| DATED | : June 28, 2022 | |
| INVENTOR(S) | : Steven Edward Coe et al. | |

It is certified that error appears in the above-identified patent and that said Letters Patent is hereby corrected as shown below:

In the Claims

Column 19, Line 48, replace "has inlets/cm$^2$ and equal to or less than 100 gas" with -- gas inlets/cm$^2$ and equal to or less than 100 gas --.

Signed and Sealed this
Third Day of January, 2023

Katherine Kelly Vidal
*Director of the United States Patent and Trademark Office*